(12) United States Patent
Ye

(10) Patent No.: US 12,575,383 B2
(45) Date of Patent: Mar. 10, 2026

(54) MANUFACTURING METHOD FOR SEMICONDUCTOR DEVICE AND SEMICONDUCTOR DEVICE

(71) Applicant: WUHAN XINXIN SEMICONDUCTOR MANUFACTURING CO., LTD., Wuhan (CN)

(72) Inventor: Guoliang Ye, Wuhan (CN)

(73) Assignee: WUHAN XINXIN SEMICONDUCTOR MANUFACTURING CO., LTD., Wuhan (CN)

( * ) Notice: Subject to any disclaimer, the term of this patent is extended or adjusted under 35 U.S.C. 154(b) by 550 days.

(21) Appl. No.: 18/155,745

(22) Filed: Jan. 18, 2023

(65) Prior Publication Data

US 2023/0154807 A1 May 18, 2023

Related U.S. Application Data

(63) Continuation of application No. PCT/CN2020/126792, filed on Nov. 5, 2020.

(30) Foreign Application Priority Data

Oct. 21, 2020 (CN) .......................... 202011134955.8

(51) Int. Cl.
H01L 23/66 (2006.01)
H01L 21/66 (2006.01)
H01L 23/00 (2006.01)

(52) U.S. Cl.
CPC .............. H01L 22/32 (2013.01); H01L 22/14 (2013.01); H01L 24/03 (2013.01); H01L 24/05 (2013.01);

(Continued)

(58) Field of Classification Search
CPC ......... H01L 22/32; H01L 22/14; H01L 24/03; H01L 24/05; H01L 2224/03019;

(Continued)

(56) References Cited

U.S. PATENT DOCUMENTS

2005/0245050 A1* 11/2005 Tsao ........................ H01L 24/05
438/460
2006/0043992 A1 3/2006 Jimi

FOREIGN PATENT DOCUMENTS

CN 1628379 A 6/2005
CN 1741260 A 3/2006

(Continued)

OTHER PUBLICATIONS

International search report and Written Opinion of the International Search Authority, International Application No. PCT/CN2020/126792,mailed Jul. 21, 2021(16 pages).

(Continued)

*Primary Examiner* — Fernando L Toledo
*Assistant Examiner* — Shawn Shaw Muslim

(57) ABSTRACT

A manufacturing method for a semiconductor device includes: obtaining a pre-processed semiconductor structure, wherein the pre-processed semiconductor structure comprises a metal layer (103) having a first exposed surface (1032), and the first exposed surface (1032) of the metal layer has a protrusion portion (1031); arranging a protective layer (104) on the first exposed surface (1032) of the metal layer, wherein the protective layer (104) at least covers part of the metal layer (103) that excludes the protrusion portion (1031); removing the protrusion portion (1031) to form on the metal layer (103) a second exposed surface (1033) of the metal layer (103); and forming a dielectric layer (105) on an area where the first exposed surface (1032) is located, (Continued)

wherein the dielectric layer (105) completely covers the area where the first exposed surface (1032) is located.

20 Claims, 11 Drawing Sheets

(52) U.S. Cl.
CPC ............... *H01L 2224/03019* (2013.01); *H01L 2224/03831* (2013.01); *H01L 2224/0384* (2013.01); *H01L 2224/05124* (2013.01); *H01L 2224/05647* (2013.01)

(58) Field of Classification Search
CPC ... H01L 2224/03831; H01L 2224/0384; H01L 2224/05124; H01L 2224/05647; H01L 22/34; H01L 21/02104; H01L 21/02107; H01L 21/02697
See application file for complete search history.

(56) References Cited

FOREIGN PATENT DOCUMENTS

| CN | 1848406 | A | 10/2006 |
|----|---------|---|---------|
| CN | 101047156 | A | 10/2007 |
| CN | 105006447 | A | 10/2015 |
| CN | 109166843 | A | 1/2019 |
| JP | 2012028596 | A | 2/2012 |

OTHER PUBLICATIONS

Chinese first office action, Application No. 202011134955.8, mailed Oct. 18, 2021(18 pages).

Quirk, Michael et al., translated by Han Zhengsheng et al. Section 18.2 "Traditional Planarization Technology" Semiconductor Manufacturing Technology Jan. 31, 2004 pp. 480-483, Figures 18.5-18.7, Electronic Industry Press.

\* cited by examiner

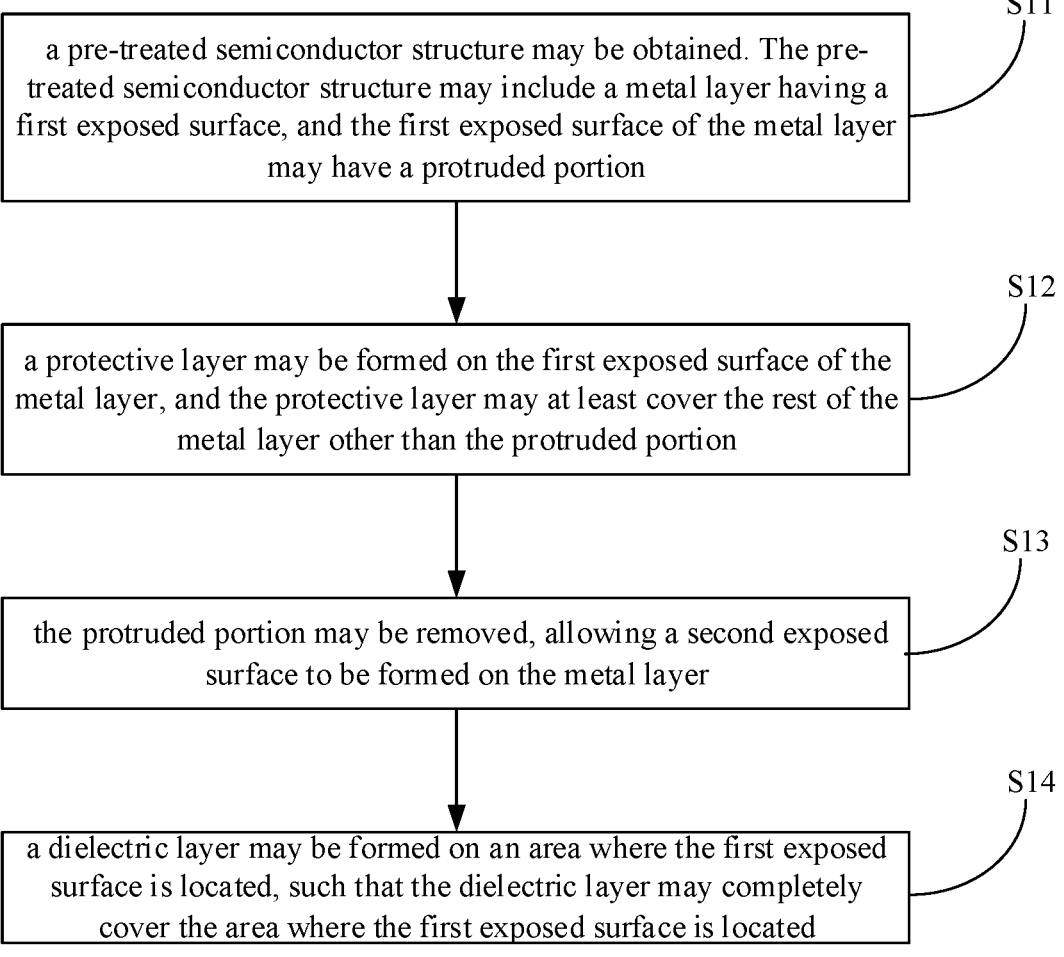

a pre-treated semiconductor structure may be obtained. The pre-treated semiconductor structure may include a metal layer having a first exposed surface, and the first exposed surface of the metal layer may have a protruded portion

S11 a protective layer may be formed on the first exposed surface of the metal layer, and the protective layer may at least cover the rest of the metal layer other than the protruded portion

S12 the protruded portion may be removed, allowing a second exposed surface to be formed on the metal layer

S13 a dielectric layer may be formed on an area where the first exposed surface is located, such that the dielectric layer may completely cover the area where the first exposed surface is located

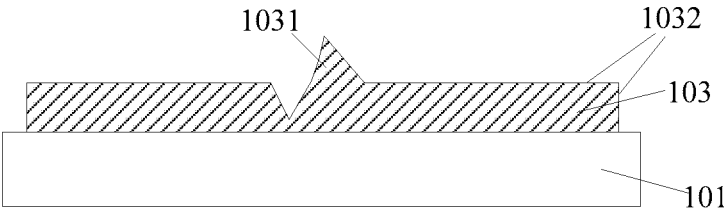

the semiconductor structure may be provided. The semiconductor structure may include the substrate, the capping layer disposed on the surface of the substrate, and the metal layer disposed in the capping layer — S201 the opening may be formed in the capping layer, such that the first exposure surface may be formed on the metal layer — S202 the probe may be inserted into the first exposed surface of the metal layer to perform the electrical test on the semiconductor structure, allowing the protruded portion to be formed on the first exposed surface of the metal layer — S203 the protective layer may be deposited on the first exposed surface of the metal layer. The thickness of the protective layer covering the protruded portion may be less than the thickness of the protective layer covering the rest of the metal layer other than the protruded portion — S204 the protective layer covering the protruded portion may be removed by dry etching to expose the protruded portion, and at the same time, the thickness of the protective layer covering the rest of the metal layer other than the protruded portion may be reduced — S205 the exposed protruded portion may be wet etched to form the second exposed surface on the metal layer — S206 the dielectric layer may be formed on the area where the first exposed surface is located, such that the dielectric layer may cover the entire area where the first exposed surface is located — S207 the surface of the dielectric layer may be planarized to obtain a dielectric layer having a planarized surface — S208 a through hole may be defined in the dielectric layer after the planarization, allowing the metal layer to be partially exposed — S209 metal may be received in and fill the through hole to form the conductive plug — S210 bonding is performed to electrically bond the semiconductor structure to another semiconductor structure by the conductive plug — S211

FIG. 3

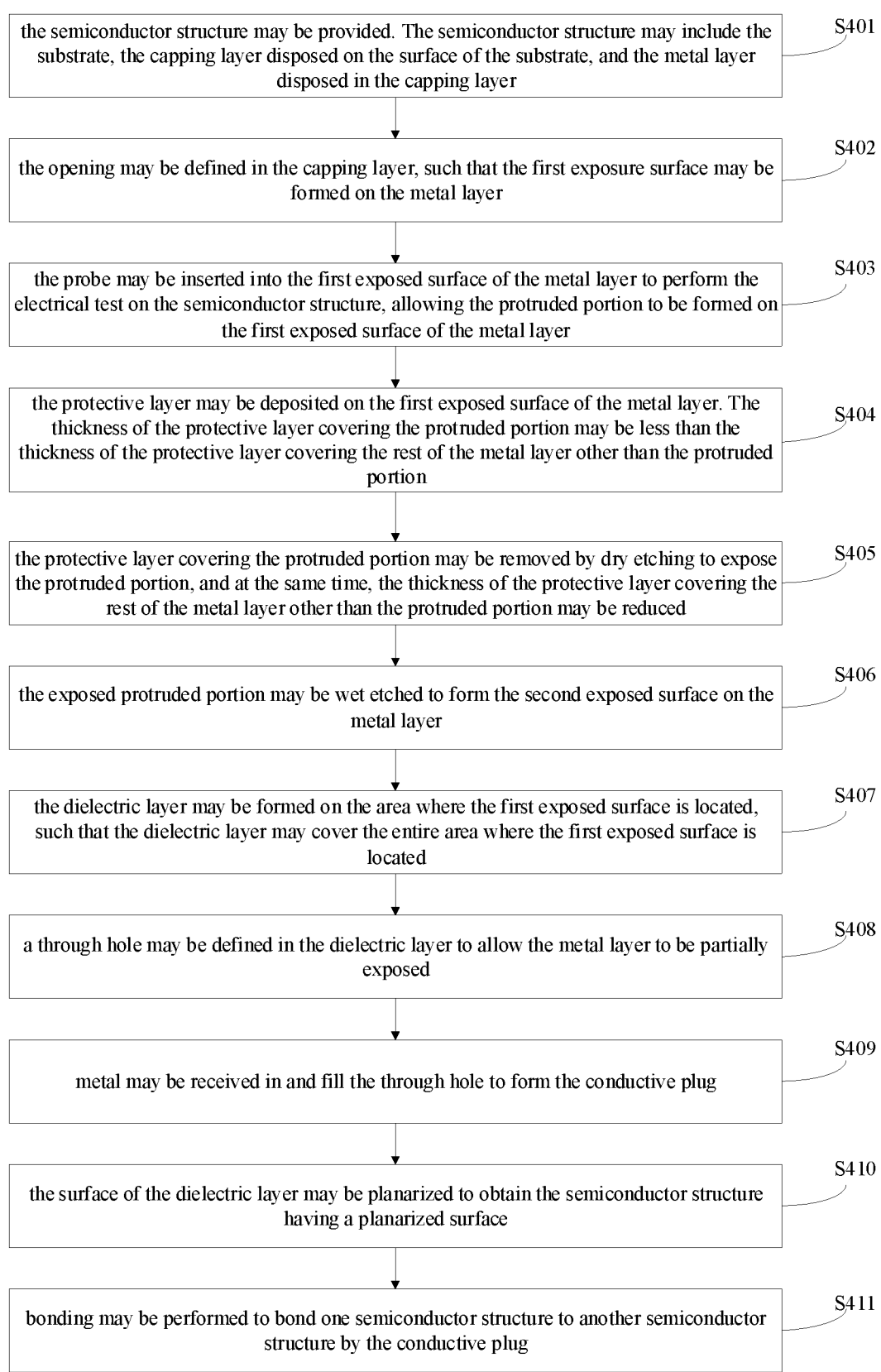

the semiconductor structure may be provided. The semiconductor structure may include the substrate, the capping layer disposed on the surface of the substrate, and the metal layer disposed in the capping layer — S401 the opening may be defined in the capping layer, such that the first exposure surface may be formed on the metal layer — S402 the probe may be inserted into the first exposed surface of the metal layer to perform the electrical test on the semiconductor structure, allowing the protruded portion to be formed on the first exposed surface of the metal layer — S403 the protective layer may be deposited on the first exposed surface of the metal layer. The thickness of the protective layer covering the protruded portion may be less than the thickness of the protective layer covering the rest of the metal layer other than the protruded portion — S404 the protective layer covering the protruded portion may be removed by dry etching to expose the protruded portion, and at the same time, the thickness of the protective layer covering the rest of the metal layer other than the protruded portion may be reduced — S405 the exposed protruded portion may be wet etched to form the second exposed surface on the metal layer — S406 the dielectric layer may be formed on the area where the first exposed surface is located, such that the dielectric layer may cover the entire area where the first exposed surface is located — S407 a through hole may be defined in the dielectric layer to allow the metal layer to be partially exposed — S408 metal may be received in and fill the through hole to form the conductive plug — S409 the surface of the dielectric layer may be planarized to obtain the semiconductor structure having a planarized surface — S410 bonding may be performed to bond one semiconductor structure to another semiconductor structure by the conductive plug — S411

FIG. 5

MANUFACTURING METHOD FOR SEMICONDUCTOR DEVICE AND SEMICONDUCTOR DEVICE

CROSS REFERENCE TO RELATED APPLICATIONS

The present application is a continuation-application of International (PCT) Patent Application No. PCT/CN2020/126792, filed on Nov. 5, 2020, which claims the priority of Chinese patent application No. 202011134955.8, filed on Oct. 21, 2020, and the entire contents of which are hereby incorporated by reference in their entireties.

TECHNICAL FIELD

The present disclosure relates to the field of manufacturing semiconductor devices, and in particular to a method of manufacturing a semiconductor device and a semiconductor device.

BACKGROUND

An electrical test may be performed to determine quality of a semiconductor device while manufacturing the semiconductor device. However, a probe for performing the electrical test may be stuck into a metal layer of the device, causing deformation of the metal layer. A height of deformation may be as high as 3 micrometers or more. After the electrical test, a post-processing, such as bonding, photolithography and so on, may be performed on the semiconductor device. While performing the post-processing, a probe mark on a surface of an aluminum pad may cause processing abnormalities, and the device may be scrapped. In the art, no particular process is available to treat the surface of the metal layer that has the probe mark. Therefore, the electrical test for the semiconductor device may be omitted, and the post-processing may be performed directly. Other tests may be performed after all processes are completed. However, when the electrical test is omitted in the manufacturing process and performed after all processes being completed, it may be difficult to find out whether an electrical abnormality is caused before the post-processing or in the post-processing. When the semiconductor device has the electrical abnormality before the post-processing, failure of identifying the abnormality may cause waste of the post-processing processes and material.

SUMMARY OF THE DISCLOSURE

According to a first aspect of the present disclosure, a method of manufacturing a semiconductor device is provided and includes: obtaining a pre-treated semiconductor structure, wherein the pre-treated semiconductor structure comprises a metal layer having a first exposed surface, and the first exposed surface of the metal layer has a protruded portion; forming a protective layer on the first exposed surface of the metal layer, wherein the protective layer at least covers the rest of the metal layer other than the protruded portion; removing the protruded portion to expose a part of the first exposed surface of the metal layer, wherein the exposed part of the first surface of the metal layer is defined as a second exposed surface of the metal layer; and forming a dielectric layer on an area where the first exposed surface is located, wherein the dielectric layer covers the entire area where the first exposed surface is located.

In some embodiments, the obtaining a pre-treated semiconductor structure includes: providing a semiconductor structure, wherein the semiconductor structure comprises a substrate, a capping layer disposed on a surface of the substrate, and a metal layer disposed in the capping layer of the substrate; forming an opening in the capping layer to expose a part of the metal layer to form the first exposed surface; and inserting a probe into the first exposed surface of the metal layer to perform an electrical test for the semiconductor structure, allowing the protruded portion to be formed on the first exposed surface of the metal layer.

In some embodiments, the obtaining a pre-treated semiconductor structure, includes: providing a semiconductor structure, wherein the semiconductor structure comprises a substrate and a metal layer disposed on a surface of the substrate, an exposed surface of the metal layer serves as the first exposed surface; and inserting a probe into the first exposed surface of the metal layer to perform an electrical test for the semiconductor structure, allowing the protruded portion to be formed on the surface of the metal layer.

In some embodiments, the forming a protective layer on the first exposed surface of the metal layer, includes: depositing the protective layer on the first exposed surface of the metal layer, wherein a thickness of a portion of the protective layer, which covers the protruded portion, is less than a thickness of another portion of the protective layer, which covers the rest of the metal layer other than the protruded portion.

In some embodiments, the protective layer is deposited on the first exposed surface of the metal layer by chemical vapor deposition, and the protective layer is any one of a silicon dioxide layer and a silicon nitride layer.

In some embodiments, the removing the protruded portion to allow a second exposed surface to be formed on the metal layer, includes: removing the portion of the protective layer covering the protruded portion by performing dry etching to expose the protruded portion, while reducing the thickness of the another portion of the protective layer covering the rest of the metal layer other than the protruded portion simultaneously; and performing wet etching on the exposed protruded portion to form the second exposed surface of the metal layer.

In some embodiments, the removing the protruded portion to allow a second exposed surface to be formed on the metal layer, includes: removing the exposed protruded portion by cutting.

In some embodiments, the removing the protruded portion to allow a second exposed surface to be formed on the metal layer, includes: removing the protruded portion and the protective layer covering the protruded portion by cutting.

In some embodiments, after the forming a dielectric layer on an area where the first exposed surface is located, wherein the dielectric layer covers the entire area where the first exposed surface is located, the method further includes: planarizing a surface of the dielectric layer.

In some embodiments, after the planarizing a surface of the dielectric layer, the method further includes: forming a conductive plug in the dielectric layer, wherein an end of the conductive plug is connected to the first exposed surface of the metal layer, and the conductive plug is configured to achieve electrical lead-out for the metal layer.

In some embodiments, the forming a conductive plug on the dielectric layer, includes: forming a through hole in the planarized dielectric layer and/or the protective layer, to expose a part of the metal layer; and filling conductive material in the through hole.

In some embodiments, the metal layer is made of aluminum, and the conductive plug is made of copper.

In some embodiments, an end of the conductive plug in the through hole is exposed from the dielectric layer, and a surface of the exposed end of the conductive plug aligns with a surface of the dielectric layer away from the metal layer.

According to another aspect of the present disclosure, a semiconductor device, which is manufacture by the above method, is provided. The semiconductor device includes: a substrate, a metal layer, a protective layer, a dielectric layer. The metal layer has a first surface. The metal layer is formed on the substrate, and the first surface of the metal layer is a surface of the metal layer far away from the substrate. The protective layer covers a first area of the first surface of the metal layer, and does not cover a second area of the first surface of the metal layer. The dielectric layer is formed on the protective layer and the second area of the first surface of the metal layer.

In some embodiments, the second area of the first surface of the metal layer is an area of removing a protruded portion formed on the first surface of the metal layer, and the protruded portion is formed by inserting a probe into the first surface of the metal layer to perform an electrical test.

In some embodiments, a recess is defined in the first area of the first surface, a wall of the recess is covered by the protective layer, and a portion of the protective layer is received in the recess.

In some embodiments, the recess is formed by inserting the probe into the first surface of the metal layer to perform an electrical test.

In some embodiments, a through hole is formed in the dielectric layer and/or the protective layer, and a conductive plug is formed in the through hole and connected to the first surface of the metal layer, to achieve electrical lead-out for the metal layer.

In some embodiments, an end of the conductive plug in the through hole is exposed from the dielectric layer, and a surface of the exposed end of the conductive plug aligns with a surface of the dielectric layer away from the metal layer.

In some embodiments, the metal layer is made of aluminum, and the conductive plug is made of copper.

BRIEF DESCRIPTION OF THE DRAWINGS

FIG. 1 is a flow chart of a method of manufacturing a semiconductor device according to the present disclosure.

FIG. 2*a* is a structural schematic view of a product corresponding to an operation of the method of manufacturing the semiconductor device shown in FIG. 1.

FIG. 3 is a flow chart of a method of manufacturing a semiconductor device according to an embodiment of the present disclosure.

FIG. 5 is a flow chart of a method of manufacturing a semiconductor device according to another embodiment of the present disclosure.

DETAILED DESCRIPTION

Technical solutions in embodiments of the present disclosure will be clearly and completely described below by referring to accompanying drawings in the embodiments of the present disclosure. Apparently, the described embodiments are only a part of but not all of the embodiments of the present disclosure.

As shown in FIG. 1 and FIGS. 2*a* to 2*g*, FIG. 1 is a flow chart of a method of manufacturing a semiconductor device according to the present disclosure, and FIGS. 1*a* to 1*g* are structural schematic views of products corresponding to operations of the method of manufacturing the semiconductor device shown in FIG. 1. The method of manufacturing the semiconductor device of the present embodiment may include following operations.

In an operation S11, a pre-treated semiconductor structure may be obtained. The pre-treated semiconductor structure may include a metal layer having a first exposed surface, and the first exposed surface of the metal layer may have a protruded portion.

Figure 2B:
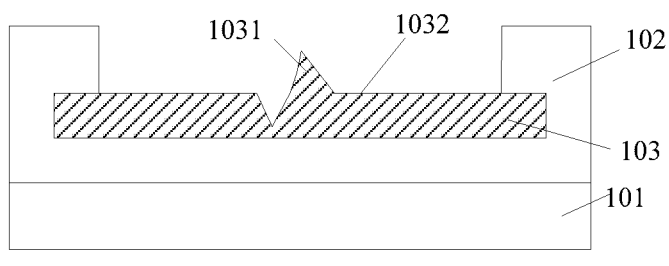
FIG. 2*b* is a structural schematic view of a product corresponding to another operation of the method of manufacturing the semiconductor device shown in FIG. 1.

In detail, the semiconductor structure may be provided. As shown in FIG. 2a, the semiconductor structure may include a substrate 101, and a metal layer 103 disposed on a surface of the substrate 101. The exposed surface of the metal layer 103 may be a first exposure surface 1032. In detail, the first exposure surface 1032 may be a surface of the metal layer 103 away from the substrate 101 and a side face of the metal layer 103. A probe may be inserted into the first exposed surface 1032 of the metal layer 103 to perform an electrical test on the semiconductor structure, allowing the protruded portion 1031 to be formed on the first exposed surface 1032 of the metal layer 103. In another embodiment, as shown in FIG. 2b, the semiconductor structure may include the substrate 101, a capping layer 102 disposed on the surface of the substrate 101, and the metal layer 103 disposed in the capping layer 102. An opening may be defined in the capping layer 10 to expose a part of the metal layer 103. An exposed surface of the metal layer 103 may be the first exposed surface 1032. The probe may be inserted into the first exposed surface 1032 of the metal layer 103 to perform the electrical test on the semiconductor structure, allowing the protruded portion 1031 to be formed on the first exposed surface 1032 of the metal layer 103.

In an operation S12, a protective layer may be formed on the first exposed surface of the metal layer, and the protective layer may at least cover the rest of the metal layer other than the protruded portion.

Figure 2C:
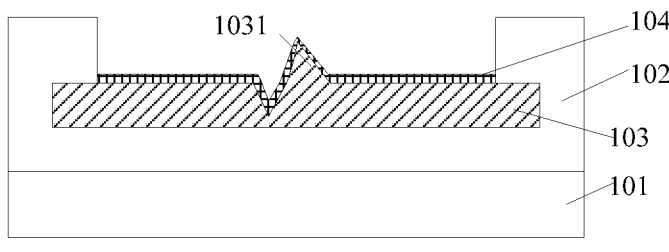
FIG. 2*c* is a structural schematic view of a product corresponding to still another operation of the method of manufacturing the semiconductor device shown in FIG. 1.
Figure 2D:
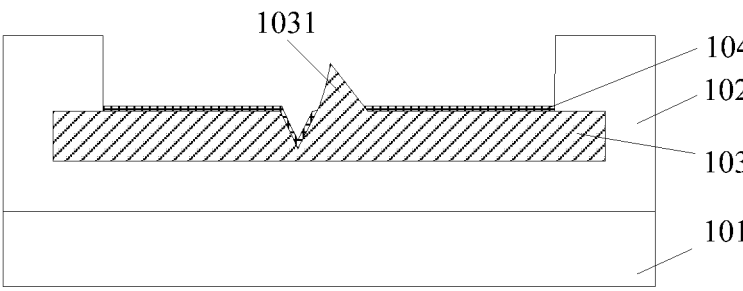
FIG. 2*d* is a structural schematic view of a product corresponding to still another operation of the method of manufacturing the semiconductor device shown in FIG. 1.

In detail, as shown in FIG. 2c, the protective layer 104 may be deposited on the first exposed surface 1032 of the metal layer 103 to provide a step coverage for the first exposed surface 1032 of the metal layer 103, such that a thickness of the protective layer 104, which covers the protruded portion 103, may be less than a thickness of the protective layer 104, which covers the rest portion of the metal layer 103 other than the protruded portion 103. The protective layer 104 that covers the protruded portion 103 may be removed by performing dry etching. At the same time, the thickness of the protective layer 104, which covers the rest portion of the metal layer 103 other than the protruded portion 103, may be reduced. In another embodiment, as shown in FIG. 2d, the protective layer 104 may be deposited on the first exposed surface 1032 of the metal layer 103. The protective layer 104 may cover the rest portion of the metal layer other than the protruded portion 1031, and the protective layer 104 that covers the protruded portion 1031 may not need to be removed.

In an embodiment, the protective layer 104 may be deposited on the first exposed surface 1032 of the metal layer 103 by chemical vapor deposition, and the protective layer 104 may be a silicon dioxide layer or a silicon nitride layer.

In an operation S13, the protruded portion may be removed, allowing a second exposed surface to be formed on the metal layer.

Figure 2E:
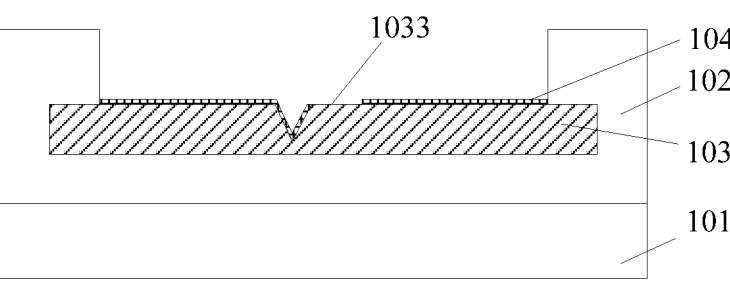
FIG. 2*e* is a structural schematic view of a product corresponding to still another operation of the method of manufacturing the semiconductor device shown in FIG. 1.

In detail, as shown in FIG. 2e, dry etching may be performed on the protruded portion 1031 to expose the protruded portion 1031 firstly, and subsequently, wet etching may be performed on the exposed protruded portion 1031 to form the second exposed surface 1033 on the metal layer 103. In an embodiment, the exposed protruded portion 1031 may be removed by cutting the protruded portion 1031 to form the second exposed surface 1033 on the metal layer 103. In an embodiment, when the protective layer 104 covering the protruded portion 1031 is not removed, the protruded portion 1031 and the protective layer 104 covering the protruded portion 1031 may be removed together by cutting, such that the second exposed surface 1033 may be formed on the metal layer 103.

In an operation S14, a dielectric layer may be formed on an area where the first exposed surface is located, such that the dielectric layer may completely cover the area where the first exposed surface is located.

In detail, the dielectric layer 105 may be deposited by chemical vapor deposition on the metal layer 103 that has the protruded portion 1031 removed, such that the dielectric layer 105 may cover the area 1032 where the first exposed surface is located. That is, the dielectric layer 105 may cover the protective layer 104 and the second exposed surface 1033.

Figures 2F, 2G:
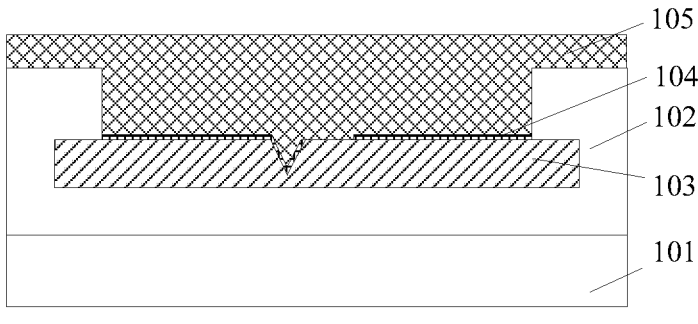
FIG. 2*f* is a structural schematic view of a product corresponding to still another operation of the method of manufacturing the semiconductor device shown in FIG. 1.
FIG. 2*g* is a structural schematic view of a product corresponding to still another operation of the method of manufacturing the semiconductor device shown in FIG. 1.

In an embodiment, as shown in FIG. 2f, the dielectric layer 105 may be formed on the area where the first exposed surface 1032 is located, such that the dielectric layer 105 may completely cover the area where the first exposed surface 1032 is located. The area where the first exposed surface 1032 is located may be a part of the surface of the metal layer 103 exposed through the opening in the capping layer 102. The area where the first exposed surface 1032 is located before the protruded portion 1031 being removed and the area where the first exposed surface 1032 is located after the protruded portion 1031 being removed may be a same area.

In another embodiment, as shown in FIG. 2g, the dielectric layer 105 may be formed on the area where the metal layer 103 is located, such that the dielectric layer 105 may completely cover the area where the metal layer 103 is located. The area where the first exposed surface 1032 is located may be a part of the surface of the metal layer 103 that does not contact the substrate 101. The area where the first exposed surface 1032 is located before the protruded portion 1031 being removed and the area where the first exposed surface 1032 is located after the protruded portion 1031 being removed may be a same area.

The dielectric layer 105 may be a silicon oxide layer, a silicon nitride layer or a composite layer of silicon oxide and silicon nitride. The dielectric layer 105 may be configured for protecting the metal layer 103 in subsequent processes. A surface of the dielectric layer 105 may be planarized. In an embodiment, a conductive plug may be formed in the dielectric layer 105. An end of the conductive plug may be connected to the first exposed surface 1032 of the metal layer 103 that has the protruded portion 1031 removed. The conductive plug is used to electrically lead out the metal layer 103. In an embodiment, the surface of the dielectric layer 105 may be planarized. The planarized surface of the dielectric layer 105 may not be lower than the surface of the metal layer 103. A through hole may be defined in the planarized dielectric layer 105, such that the metal layer 103 may be partially exposed. Conductive material may be received in and fill the through hole. Material of the metal layer 103 may be aluminum, and material of the conductive plug may be copper.

Subsequently, the method may further include other processing, such as bonding, photolithography, and so on.

As shown in FIGS. 3 and 4a-4k, FIG. 3 is a flow chart of a method of manufacturing a semiconductor device according to an embodiment of the present disclosure, and FIGS. 3a to 3k are structural schematic views of products corresponding to operations of the method of manufacturing the semiconductor device shown in FIG. 3. The method of manufacturing the semiconductor device of the present embodiment may include following operations.

In an operation S201, the semiconductor structure may be provided. The semiconductor structure may include the substrate, the capping layer disposed on the surface of the substrate, and the metal layer disposed in the capping layer.

Figure 4A:
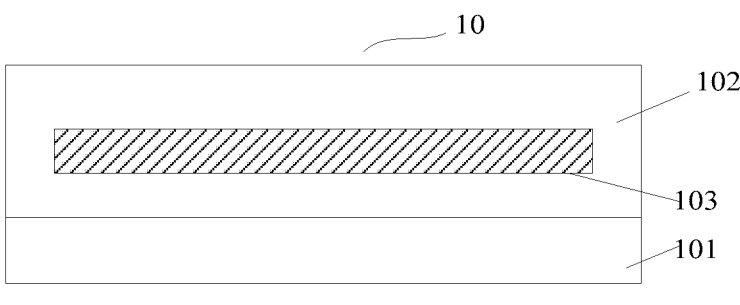
FIG. 4*a* is a structural schematic view of a product corresponding to an operation of the method of manufacturing the semiconductor device shown in FIG. 3.

In detail, the provided semiconductor structure 10 may be a wafer or other semiconductor structure 10. In the present embodiment, the semiconductor structure 10 may be the wafer. As shown in FIG. 4a, the semiconductor structure 10 may include the substrate 101, the capping layer 102, and the metal layer 103. The capping layer 102 may cover the surface of the substrate 101. The metal layer 103 may be disposed in the capping layer 102.

In an embodiment, the substrate 101 may be made of semiconductor material. For example, the substrate 101 may be a Si substrate, a Ge substrate, a SiGe substrate, a Silicon On Insulator (SOI), or a Germanium On Insulator (GOI), and so on. In an embodiment, the substrate 101 may also be a substrate 101 that includes other elements or compounds, such as GaAs, InP, SiC, and so on. In an embodiment, the substrate 101 may be a structure having laminated layers, such as Si/SiGe, and so on. In an embodiment, the substrate 101 may be an epitaxial structure, such as a silicon germanium on insulator (SGOI) and so on. In the present embodiment, the substrate 101 may be the Si substrate.

In an embodiment, the capping layer 102 may be an insulating dielectric layer. The cover 102 may be a single layer or a structure having laminated layers. For example, material of the capping layer 102 may be silicon nitride, silicon oxide, or a combination thereof. The silicon oxide may be Fluorinated Silicate Glass (FSG). The capping layer 102 may serve as a barrier to prevent elements of the metal layer 103 from diffusing into the substrate 101.

In an embodiment, the metal layer 103 may be disposed in one capping layer 102 or between stacked adjacent capping layers 102. The material of the metal layer 103 may be one of copper, aluminum, tungsten and so on, or may be other conductive materials. In the present embodiment, the material of the metal layer 103 may be aluminum.

In an operation S202, the opening may be formed in the capping layer, such that the first exposure surface may be formed on the metal layer.

Figure 4B:
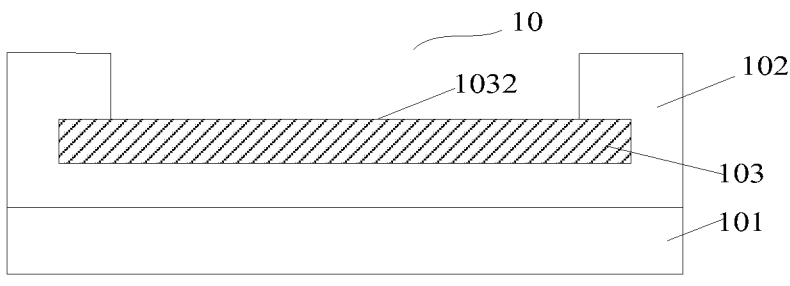
FIG. 4*b* is a structural schematic view of a product corresponding to another operation of the method of manufacturing the semiconductor device shown in FIG. 3.

In detail, as shown in FIG. 4b, the surface of the capping layer 102 away from the substrate 101 may be dry etched, allowing the surface of the metal layer 103 in the capping layer 102 to be exposed to form the first exposure surface 1032. In an embodiment, a width of the opening defined in the capping layer 102 may be less than a width of the metal layer 103. In detail, a position of the capping layer 102 to define the opening may be determined, and plasma etching may be performed, till the surface of the metal layer 103 in the capping layer 102 is exposed. The exposed surface of the metal layer 103 may be the first exposed surface 1032. Other dry etching operations may be performed to expose the surface of the metal layer 103.

In an operation S203, the probe may be inserted into the first exposed surface of the metal layer to perform the electrical test on the semiconductor structure, allowing the protruded portion to be formed on the first exposed surface of the metal layer.

Figure 4C:
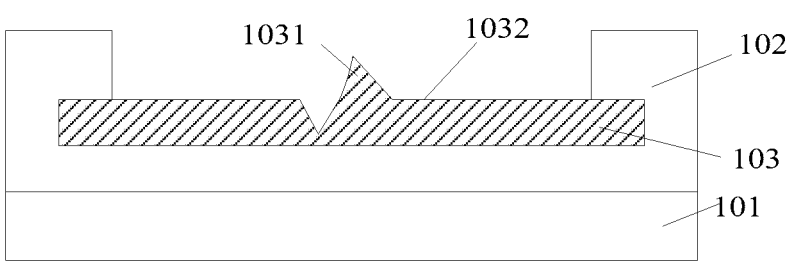
FIG. 4*c* is a structural schematic view of a product corresponding to still another operation of the method of manufacturing the semiconductor device shown in FIG. 3.

In detail, the electrical test may be performed on the semiconductor structure 10. The probe for the electrical test may be inserted to an inside of the metal layer 103 from the first exposed surface 1032 of the metal layer 103 exposed at the opening of the capping layer 102. The protruded portion 1031 may be formed on the first exposed surface 1032 of the metal layer 103 in an area adjacent to a position where the probe is inserted. Electrical properties of the semiconductor structure 10 may be tested to determine whether the semiconductor structure 10 is defective. When the test is completed, the probe may be pulled out, a recessed area and the protruded portion 1031 may be formed on the first exposed surface 1032 of the metal layer 103, as shown in FIG. 4c. In this way, the semiconductor structure 10 after a pre-treatment may be obtained.

In an operation S204, the protective layer may be deposited on the first exposed surface of the metal layer. The thickness of the protective layer covering the protruded portion may be less than the thickness of the protective layer covering the rest of the metal layer other than the protruded portion.

Figure 4D:
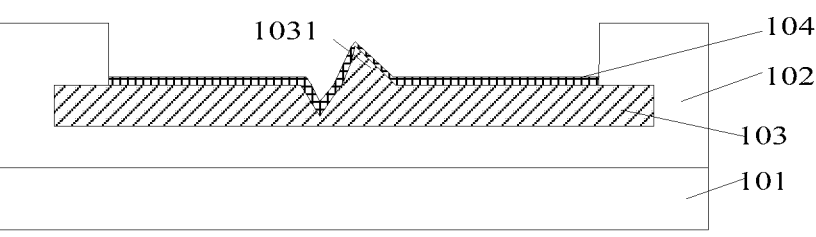
FIG. 4*d* is a structural schematic view of a product corresponding to still another operation of the method of manufacturing the semiconductor device shown in FIG. 3.

In detail, the protective layer 104 may be deposited on the first exposed surface 1032 of the metal layer 103 by chemical vapor deposition, such that the thickness of the protective layer 104 deposited on the protruded portion 1031 may be less than the thickness of the protective layer 104 deposited on a surface of the rest of the metal layer 103 other than the protruded portion 1031. In another embodiment, the protective layer may also be disposed on the metal layer 103 by thermal oxidation film formation, gluing, metal sputtering, and so on. In this way, the thickness of the protective layer 104 covering the surface of the protruded portion 1031 may be less than the thickness of the protective layer 104 covering the surface of the rest of the metal layer other than the protruded portion 1031, such that the protective layer 104 that covers the metal layer 103 may exhibit step coverage, as shown in FIG. 4d. In another embodiment, the protective layer 104 may be made of nitride material or oxide material. In the present embodiment, the material of the protective layer 104 may be silicon dioxide or silicon nitride.

In an operation S205, the protective layer covering the protruded portion may be removed by dry etching to expose the protruded portion, and at the same time, the thickness of the protective layer covering the rest of the metal layer other than the protruded portion may be reduced.

Figure 4E:
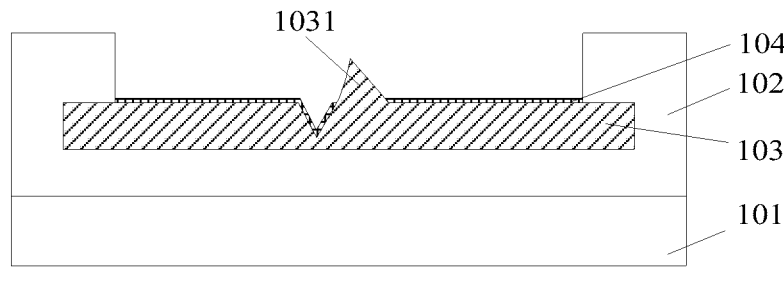
FIG. 4*e* is a structural schematic view of a product corresponding to still another operation of the method of manufacturing the semiconductor device shown in FIG. 3.

In detail, as shown in FIG. 4e, the protective layer 104 that provides the step coverage for the metal layer 103 may be etched. In an embodiment, the protective layer 104 on the metal layer 103 may be etched by plasma etching until the entire protective layer 104 covering the protruded portion 103 of the metal layer 103 is removed. The surface of the rest of the metal layer 103 other than the protruded portion may still be covered by the protective layer 104. Etching gas may include NF3, CH3F, CHF3, and oxygen-containing gas. The fluorine (F) may be used to react with the silicon dioxide or the silicon nitride of the protective layer. The protruded portion 103 of the metal layer 103 may be exposed, and at the same time, the thickness of the protective layer 104 that covers the surface of the rest of the metal layer 103 other than the protruded portion 1031 may be reduced. In this way, a semiconductor structure 10 that the surface of the rest of the metal layer 103 other than the protruded portion 1031 is covered by the protective layer 104 may be obtained.

In an operation S206, the exposed protruded portion may be wet etched to form the second exposed surface on the metal layer.

Figure 4F:
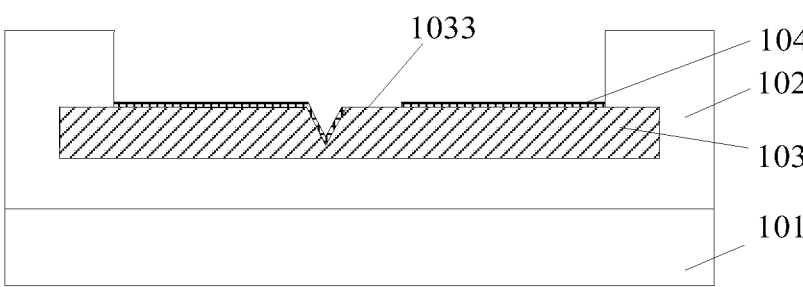
FIG. 4*f* is a structural schematic view of a product corresponding to still another operation of the method of manufacturing the semiconductor device shown in FIG. 3.

In detail, as shown in FIG. 4f, the exposed protruded portion 1031 of the metal layer 103 may be removed by wet etching. In an embodiment, the protruded portion 1031 on the metal layer 103 that is not covered by the protective layer 104 may be etched by acid washing or alkaline washing to obtain the second exposed surface 1033 of the metal layer 103. In this way, the protruded portion 1031 caused by the electrical test probe may be trimmed to prevent the protruded portion 1031 from affecting subsequent processing on the pre-treated semiconductor structure 10. To be noted that, while the exposed protruded portion is being wet etched, the protective layer 104 covering the surface of the rest of the metal layer 103 other than the protruded portion 1031 may also be partially or completely removed. An area of the second exposed surface 1033 of the metal layer 103 obtained in this way may be larger than an area of the second exposed surface 1033 of the metal layer 103 that has only the protruded portion 1031 removed. The present disclosure does not limit the areas.

In an operation S207, the dielectric layer may be formed on the area where the first exposed surface is located, such that the dielectric layer may cover the entire area where the first exposed surface is located.

Figure 4G:
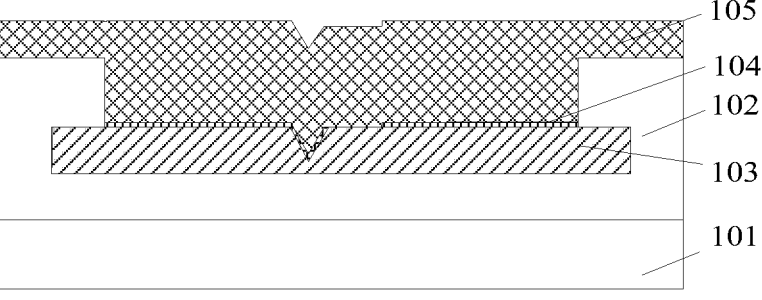
FIG. 4*g* is a structural schematic view of a product corresponding to still another operation of the method of manufacturing the semiconductor device shown in FIG. 3.

In detail, as shown in FIG. 4g, the dielectric layer 105 may be deposited by chemical vapor deposition on the second exposed surface 1033 of the metal layer 103 and on the remaining protective layer 104 covering the surface of the metal layer 103 that has the protruded portion 1031 removed. In this way, a deposited thickness of the dielectric layer 105 may not be less than a distance from the surface of the capping layer 102 away from the substrate 101 to the metal layer 103. In another embodiment, the dielectric layer 105 may be deposited by thermal oxidation film formation, gluing, metal sputtering, and so on, on the second exposed surface 1033 and on the remaining protective layer 104 covering the surface of the metal layer 103 that has the protruded portion 1031 removed. In an embodiment, the dielectric layer 105 may be made of one or combination of the nitride material and the oxide material. The material of the dielectric layer 105 may be the same as the material of the capping layer 102. The dielectric layer 105 may be configured to protect the metal layer 103 in the subsequent processes.

In an operation S208, the surface of the dielectric layer may be planarized to obtain a dielectric layer having a planarized surface.

Figure 4H:
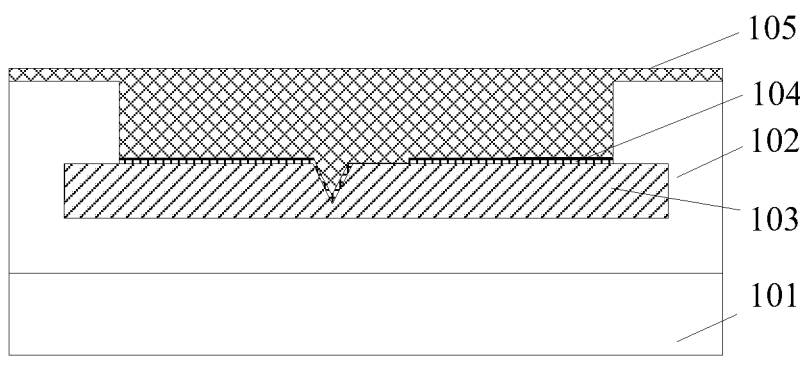
FIG. 4*h* is a structural schematic view of a product corresponding to still another operation of the method of manufacturing the semiconductor device shown in FIG. 3.

In detail, as shown in FIG. 4h, the exposed surface of the dielectric layer 105 may be flat. In an embodiment, a surface of the dielectric layer 105 away from the metal layer 103 may be planarized by performing a physical mechanical grinding process. In this way, the exposed surface of the dielectric layer 105 may be flat, and therefore, the dielectric layer 105 having the planarized surface may be obtained.

In an operation S209, a through hole may be defined in the dielectric layer after the planarization, allowing the metal layer to be partially exposed.

Figure 4I:
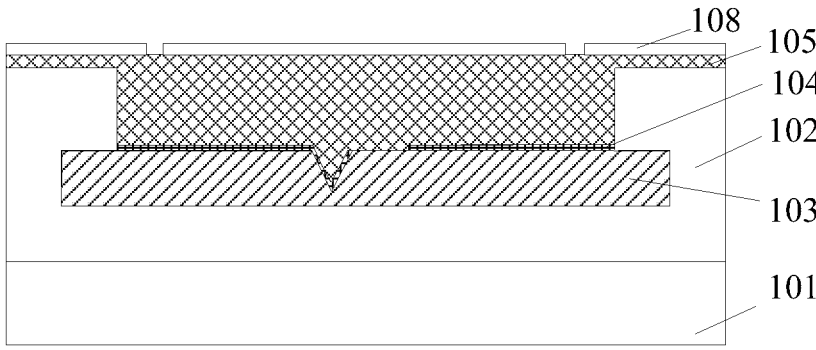
FIG. 4*i* is a structural schematic view of a product corresponding to still another operation of the method of manufacturing the semiconductor device shown in FIG. 3.
Figure 4J:
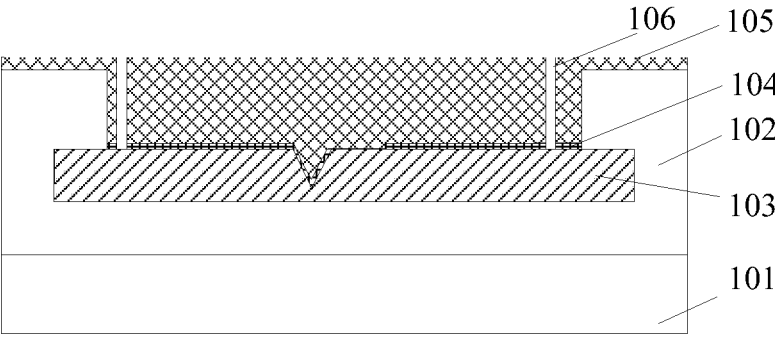
FIG. 4*j* is a structural schematic view of a product corresponding to still another operation of the method of manufacturing the semiconductor device shown in FIG. 3.

In detail, as shown in FIG. 4i, a mask layer 108 may be disposed on the dielectric layer 105 after the planarization. A window may be defined in a surface of the mask layer 108 as required. In an embodiment, the mask layer 108 may be a photoresist. In detail, after a surface of the photoresist away from the dielectric layer 105 is covered with the mask, light irradiation may be performed. A portion of the photoresist that is not irradiated may be washed away to form a through hole. In this way, the irradiated portion may form the mask layer 108, and a part of the surface of the dielectric layer 105 may be exposed through the through hole. The dielectric layer 105 exposed through the through hole may be removed by dry etching. A through hole 106 may be defined in the dielectric layer 105, and a portion of the metal layer 103 may be exposed through the through hole 106. As shown in FIG. 4j, the mask layer 108 on the dielectric layer 105 may be removed, such that the surface of the dielectric layer 105 away from the metal layer 103 may be exposed. Alternatively, the through hole 106 may be defined in the dielectric layer 105 in other ways to expose the part of the metal layer 103. It can be understood that in other embodiments, the mask layer 108 may not be removed at first. The mask layer 108 may be removed while performing the planarization after metal is received in and fill the through hole 106.

It shall be understood that the through hole 106 may be a through hole in other forms to allow the metal to connect to an external component. The above embodiment only shows an example of the through hole, but does not limit features of the through hole.

In an operation S210, metal may be received in and fill the through hole to form the conductive plug.

Figure 4K:
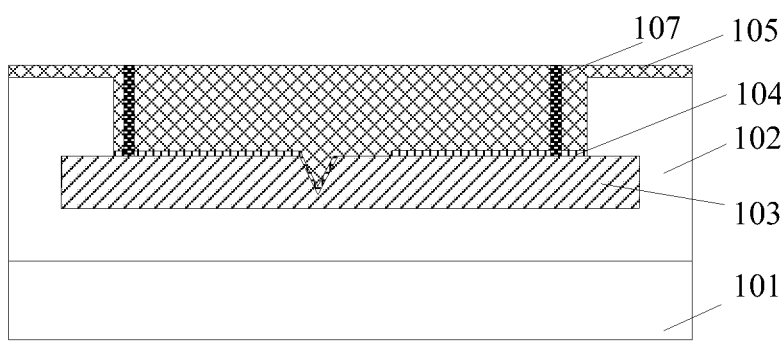
FIG. 4*k* is a structural schematic view of a product corresponding to still another operation of the method of manufacturing the semiconductor device shown in FIG. 3.

In detail, as shown in FIG. 4k, metal may be deposited in the through hole 106 at first, such that a seed layer may be formed on an inner wall of the through hole 106. Further, electroplating may be performed to fill the metal into the through hole 106, such that the conductive plug 107 may be formed in the through hole 106. An end of the conductive plug may be connected to a part of the metal layer covered by the protective layer 104. The metal deposited and electroplated on the dielectric layer 105 may be grinded, such that the surface of the dielectric layer 105 away from the metal layer 103 may be exposed. In addition, an end of the conductive plug 107 in the through hole 106 may be exposed, and a surface of the exposed end of the conductive plug 107 may align with the surface of the dielectric layer 105 away from the metal layer 103. In an embodiment, excessive deposited and electroplated metal may be removed by performing a mechanical grinding process.

In an operation S211, bonding is performed to electrically bond the semiconductor structure to another semiconductor structure by the conductive plug.

In detail, bonding may be performed to electrically bond the semiconductor structure 10 obtained in the above operations to another semiconductor structure 10 by the conductive plug 107.

According to the method of manufacturing the semiconductor device in the present disclosure, the pre-treated semiconductor structure may be obtained. The pre-treated semiconductor structure may include the metal layer having the first exposed surface. The first exposed surface of the metal layer may have the protruded portion. The protective layer may be disposed on the first exposed surface of the metal layer. The protective layer may at least cover the rest of the metal layer other than the protruded portion. The protruded portion may be removed to form the second exposed surface on the metal layer. The dielectric layer may be disposed on the area where the first exposed surface is located, and the dielectric layer may completely cover the area where the first exposed surface is located. According to the method of manufacturing the semiconductor device in the present disclosure, the protective layer may be disposed on the rest of the metal layer other than the protruded portion to protect the metal layer. The protruded portion may be etched, and the surface of the metal layer of the semiconductor structure may be trimmed. In this way, the height of the protruded portion may not be excessively high, and the dielectric layer covering the metal layer may not be excessively thick. Further, since the protruded portion may not be present, gaps may not be defined around the protruded portion while filling the dielectric layer to cover the metal layer, and subsequent processing of the semiconductor structure may not be affected. Covering the metal layer with the protective layer enabling the surface of the semiconductor structure to be flat, enabling the subsequent processing of the semiconductor structure to be performed easily. The method may be simple and may be implemented easily.

As shown in FIGS. 5 and 6a-6d, FIG. 5 is a flow chart of a method of manufacturing a semiconductor device according to another embodiment of the present disclosure, and FIGS. 5a to 5d are structural schematic views of products corresponding to operations of the method of manufacturing the semiconductor device shown in FIG. 5. The method of manufacturing the semiconductor device of the present disclosure may include following operations.

In an operation S401, the semiconductor structure may be provided. The semiconductor structure may include the substrate, the capping layer disposed on the surface of the substrate, and the metal layer disposed in the capping layer.

In an operation S402, the opening may be defined in the capping layer, such that the first exposure surface may be formed on the metal layer.

In an operation S403, the probe may be inserted into the first exposed surface of the metal layer to perform the electrical test on the semiconductor structure, allowing the protruded portion to be formed on the first exposed surface of the metal layer.

In an operation S404, the protective layer may be deposited on the first exposed surface of the metal layer. The thickness of the protective layer covering the protruded portion may be less than the thickness of the protective layer covering the rest of the metal layer other than the protruded portion.

In an operation S405, the protective layer covering the protruded portion may be removed by dry etching to expose the protruded portion, and at the same time, the thickness of the protective layer covering the rest of the metal layer other than the protruded portion may be reduced.

In an operation S406, the exposed protruded portion may be wet etched to form the second exposed surface on the metal layer.

In an operation S407, the dielectric layer may be formed on the area where the first exposed surface is located, such that the dielectric layer may cover the entire area where the first exposed surface is located.

The operations of S401 to S407 of the present disclosure may be the same as the operations of S201 to S207 in the above embodiments.

In an operation S408, a through hole may be defined in the dielectric layer to allow the metal layer to be partially exposed.

Figure 6A:
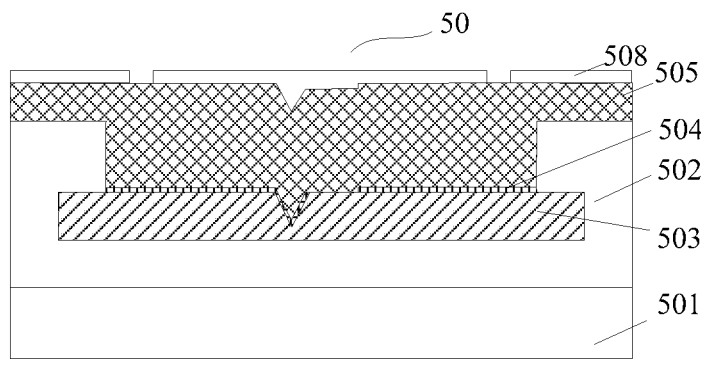
FIG. 6*a* is a structural schematic view of a product corresponding to an operation of the method of manufacturing the semiconductor device shown in FIG. 5.
Figure 6B:
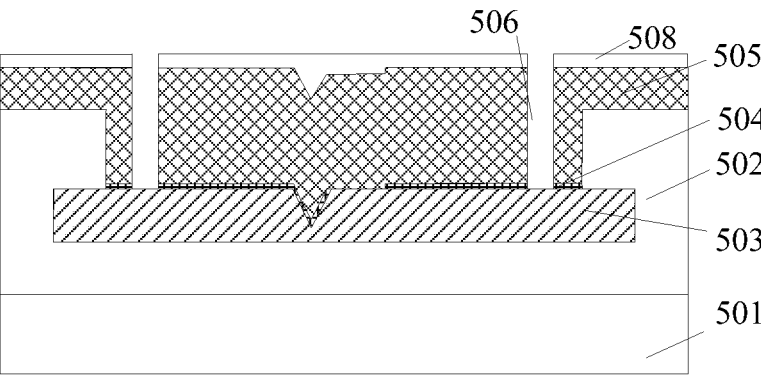
FIG. 6*b* is a structural schematic view of a product corresponding to another operation of the method of manufacturing the semiconductor device shown in FIG. 5.

In detail, as shown in FIG. 6a, the semiconductor structure 50 may include a substrate 501, a capping layer 502, and a metal layer 503. The metal layer 503 may be covered by a protective layer 504. A dielectric layer 505 may be deposited on the protective layer 504. A mask layer 508 may be disposed on the untreated dielectric layer 505. A window may be defined in a planarized surface of the mask layer 508 as needed. In an embodiment, the mask layer 508 may be a photoresist. In detail, the mask may be disposed on and cover a surface of the photoresist away from the dielectric layer 505. The mask may be irradiated after being placed on a flat area of the photoresist. The flat area of the photoresist may be the flat area of the metal layer 503. The portion of the photoresist that is not irradiated may be washed away to form the through hole, such that the portion that is irradiated may form the mask layer 508, and a portion of the surface of the dielectric layer 505 may be exposed through the through hole. As shown in FIG. 6b, the dielectric layer 505 exposed through the through hole may be removed by performing the dry etching, a through hole 506 may be defined in the dielectric layer 505, and a portion of the metal layer 503 may be exposed through the through hole 506. The mask layer 508 on the dielectric layer 505 may be removed to expose the surface of the dielectric layer 505 away from the metal layer 503. Alternatively, other means may be performed to define the through hole 506 in the dielectric layer 505 to expose a part of the metal layer 503. It can be understood that in other embodiments, the mask layer 508 may not be removed at first. The mask layer 508 may be removed while performing the planarization, after metal is placed to fill the through hole 506.

In an operation S409, metal may be received in and fill the through hole to form the conductive plug.

Figure 6C:
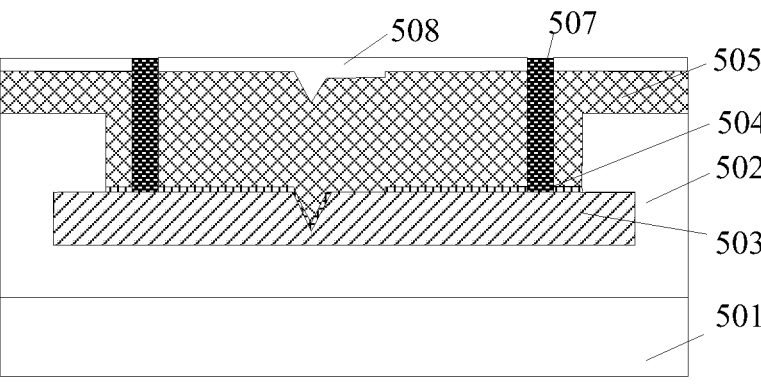
FIG. 6*c* is a structural schematic view of a product corresponding to still another operation of the method of manufacturing the semiconductor device shown in FIG. 5.

In detail, as shown in FIG. 6c, metal may be deposited in the through hole 506 at first, such that the metal may form a seed layer on the inner wall of the through hole 506. Subsequently, metal may be received in and fill the through hole 506 by electroplating, such that the conductive plug 507 may be formed in the through hole 506.

In an operation S410, the surface of the dielectric layer may be planarized to obtain the semiconductor structure having a planarized surface.

Figure 6D:
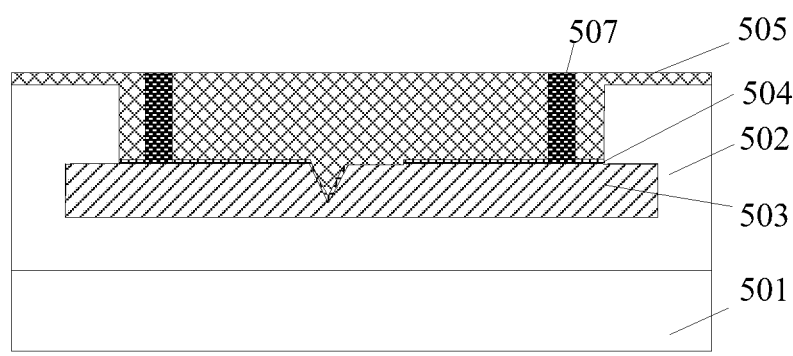
FIG. 6*d* is a structural schematic view of a product corresponding to still another operation of the method of manufacturing the semiconductor device shown in FIG. 5.

In detail, as shown in FIG. 6d, the surface of the dielectric layer 505 away from the metal layer 503 may be planarized. At the same time, the mask layer 508 disposed on the dielectric layer 505 and the deposited electroplated metal may be removed. In this way, the surface of the dielectric layer 505 away from the metal layer 503 may be exposed. At the same time, the conductive plug 507 may be treated, such that the surface of the exposed end of the conductive plug 507 may align with the surface of the planarized dielectric layer 505 away from the metal layer 503 to obtain the semiconductor structure 50 having the planarized surface.

In an operation S411, bonding may be performed to electrically bond one semiconductor structure to another semiconductor structure by the conductive plug.

In detail, bonding may be performed to electrically bond the semiconductor structure 50 obtained from the above operations to another semiconductor structure 50 the conductive plug 507.

According to the method of manufacturing the semiconductor device in the present disclosure, the pre-treated semiconductor structure may be obtained. The pre-treated semiconductor structure may include the metal layer having the first exposed surface. The first exposed surface of the metal layer may have the protruded portion. The protective layer may be disposed on the first exposed surface of the metal layer. The protective layer may at least cover the rest of the metal layer other than the protruded portion. The protruded portion may be removed to form the second exposed surface on the metal layer. The dielectric layer may be formed above the first exposed surface and the second exposed surface and may protect the metal layer. According to the method of manufacturing the semiconductor device in the present disclosure, the protective layer may be disposed on the rest of the metal layer other than the protruded portion to protect the metal layer. The protruded portion may be etched, and the surface of the metal layer of the semiconductor structure may be trimmed. In this way, the height of the protruded portion may not be excessively high, and the dielectric layer covering the metal layer may not be excessively thick. Further, since the protruded portion may not be present, gaps may not be defined around the protruded portion while filling the dielectric layer to cover the metal layer, and subsequent processing of the semiconductor structure may not be affected. The metal layer is covered with the protective layer, such that the surface of the semiconductor structure can be flat and the subsequent processing of the semiconductor structure can be performed easily. The method may be simple and may be implemented easily.

According to another aspect of the present disclosure, a semiconductor device, which is manufacture by the above method, is provided. The semiconductor device includes: a substrate, a metal layer, a protective layer, a dielectric layer. The metal layer has a first surface. The metal layer is formed on the substrate, and the first surface of the metal layer is a surface of the metal layer far away from the substrate. The protective layer covers a first area of the first surface of the metal layer, and does not cover a second area of the first surface of the metal layer. The dielectric layer is formed on the protective layer and the second area of the first surface of the metal layer.

In some embodiments, the second area of the first surface of the metal layer is an area of removing a protruded portion formed on the first surface of the metal layer, and the protruded portion is formed by inserting a probe into the first surface of the metal layer to perform an electrical test.

In some embodiments, a recess is defined in the first area of the first surface, a wall of the recess is covered by the protective layer, and a portion of the protective layer is received in the recess.

In some embodiments, the recess is formed by inserting the probe into the first surface of the metal layer to perform an electrical test.

In some embodiments, a through hole is formed in the dielectric layer and/or the protective layer, and a conductive plug is formed in the through hole and connected to the first surface of the metal layer, to achieve electrical lead-out for the metal layer.

In some embodiments, an end of the conductive plug in the through hole is exposed from the dielectric layer, and a surface of the exposed end of the conductive plug aligns with a surface of the dielectric layer away from the metal layer.

In some embodiments, the metal layer is made of aluminum, and the conductive plug is made of copper.

The above description is only an embodiment of the present disclosure and does not limit the scope of the present disclosure. Any equivalent structure or equivalent process transformation based on the contents of the specification and the accompanying drawings of the present disclosure, directly or indirectly applied in other related fields, shall be equally covered by the scope of the present disclosure.

What is claimed is:

1. A method of manufacturing a semiconductor device, comprising:

obtaining a pre-treated semiconductor structure, wherein the pre-treated semiconductor structure comprises a metal layer having a first exposed surface, and the first exposed surface of the metal layer has a protruded portion;

forming a protective layer on the first exposed surface of the metal layer, wherein the protective layer at least covers the rest of the metal layer other than the protruded portion;

removing the protruded portion to expose a part of the first exposed surface of the metal layer, wherein the exposed part of the first surface of the metal layer is defined as a second exposed surface of the metal layer;

forming a dielectric layer on an area where the first exposed surface is located, wherein the dielectric layer covers the entire area where the first exposed surface is located.

2. The method according to claim 1, wherein the obtaining a pre-treated semiconductor structure, comprises:

providing a semiconductor structure, wherein the semiconductor structure comprises a substrate, a capping layer disposed on a surface of the substrate, and a metal layer disposed in the capping layer of the substrate;

forming an opening in the capping layer to expose a part of the metal layer to form the first exposed surface; and inserting a probe into the first exposed surface of the metal layer to perform an electrical test for the semiconductor structure, allowing the protruded portion to be formed on the first exposed surface of the metal layer.

3. The method according to claim 1, wherein the obtaining a pre-treated semiconductor structure, comprises:

providing a semiconductor structure, wherein the semiconductor structure comprises a substrate and a metal layer disposed on a surface of the substrate, an exposed surface of the metal layer serves as the first exposed surface; and inserting a probe into the first exposed surface of the metal layer to perform an electrical test for the semiconductor structure, allowing the protruded portion to be formed on the surface of the metal layer.

4. The method according to claim 1, wherein the forming a protective layer on the first exposed surface of the metal layer, comprises:

depositing the protective layer on the first exposed surface of the metal layer, wherein a thickness of a portion of the protective layer, which covers the protruded portion, is less than a thickness of another portion of the protective layer, which covers the rest of the metal layer other than the protruded portion.

5. The method according to claim 4, wherein the protective layer is deposited on the first exposed surface of the metal layer by chemical vapor deposition, and the protective layer is any one of a silicon dioxide layer and a silicon nitride layer.

6. The method according to claim 4, wherein the removing the protruded portion to allow a second exposed surface to be formed on the metal layer, comprises:

removing the portion of the protective layer covering the protruded portion by performing dry etching to expose the protruded portion, while reducing the thickness of the another portion of the protective layer covering the rest of the metal layer other than the protruded portion simultaneously; and performing wet etching on the exposed protruded portion to form the second exposed surface of the metal layer.

7. The method according to claim 1, wherein the removing the protruded portion to allow a second exposed surface to be formed on the metal layer, comprises:

removing the exposed protruded portion by cutting.

8. The method according to claim 1, wherein the removing the protruded portion to allow a second exposed surface to be formed on the metal layer, comprises: removing the protruded portion and the protective layer covering the protruded portion by cutting.

9. The method according to claim 1, wherein after the forming a dielectric layer on an area where the first exposed surface is located, wherein the dielectric layer covers the entire area where the first exposed surface is located, the method further comprises:

planarizing a surface of the dielectric layer.

10. The method according to claim 9, wherein after the planarizing a surface of the dielectric layer, the method further comprises:

forming a conductive plug in the dielectric layer, wherein an end of the conductive plug is connected to the first exposed surface of the metal layer, and the conductive plug is configured to achieve electrical lead-out for the metal layer.

11. The method according to claim 10, wherein the forming a conductive plug on the dielectric layer, comprises:

forming a through hole in the planarized dielectric layer and/or the protective layer, to expose a part of the metal layer; and filling conductive material in the through hole.

12. The method according to claim 10, wherein the metal layer is made of aluminum, and the conductive plug is made of copper.

13. The method according to claim 10, wherein an end of the conductive plug in the through hole is exposed from the dielectric layer, and a surface of the exposed end of the conductive plug aligns with a surface of the dielectric layer away from the metal layer.

14. A semiconductor device, comprising:

a substrate;

a metal layer having a first surface, wherein the metal layer is formed on the substrate, and the first surface of the metal layer is a surface of the metal layer far away from the substrate;

a protective layer, covering a first area of the first surface of the metal layer, while not covering a second area of the first surface of the metal layer; wherein a recess is formed in the first area of the first surface, an inner wall of the recess is covered by the protective layer;

a dielectric layer, formed on the protective layer and the second area of the first surface of the metal layer.

15. The semiconductor device according to claim 14, wherein the second area of the first surface of the metal layer is an area of removing a protruded portion formed on the first surface of the metal layer, and the protruded portion is formed by inserting a probe into the first surface of the metal layer to perform an electrical test.

16. The semiconductor device according to claim 15, wherein and a portion of the protective layer is received in the recess.

17. The semiconductor device according to claim 16, wherein the recess is formed by inserting the probe into the first surface of the metal layer to perform an electrical test.

18. The semiconductor device according to claim 14, wherein a through hole is formed in the dielectric layer and/or the protective layer, and a conductive plug is formed in the through hole and connected to the first surface of the metal layer, to achieve electrical lead-out for the metal layer.

19. The semiconductor device according to claim 18, wherein an end of the conductive plug in the through hole is exposed from the dielectric layer, and a surface of the exposed end of the conductive plug aligns with a surface of the dielectric layer away from the metal layer.

20. The semiconductor device according to claim 19, wherein the metal layer is made of aluminum, and the conductive plug is made of copper.

\* \* \* \* \*